(12) United States Patent
Zou et al.

(10) Patent No.: US 9,496,322 B1
(45) Date of Patent: Nov. 15, 2016

(54) COA WOLED STRUCTURE AND MANUFACTURING METHOD THEREOF

(71) Applicant: Shenzhen China Star Optoelectronics Technology Co., Ltd., Shenzhen, Guangdong (CN)

(72) Inventors: Qinghua Zou, Guangdong (CN); Longqiang Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 127 days.

(21) Appl. No.: 14/429,776

(22) PCT Filed: Feb. 9, 2015

(86) PCT No.: PCT/CN2015/072563
§ 371 (c)(1),
(2) Date: Mar. 19, 2015

(87) PCT Pub. No.: WO2016/106946
PCT Pub. Date: Jul. 7, 2016

(30) Foreign Application Priority Data

Dec. 29, 2014 (CN) .......................... 2014 1 0836087

(51) Int. Cl.
*H01L 27/32* (2006.01)
*H01L 51/52* (2006.01)
*H01L 51/56* (2006.01)
*H01L 27/12* (2006.01)

(52) U.S. Cl.
CPC ....... *H01L 27/3262* (2013.01); *H01L 27/1225* (2013.01); *H01L 27/322* (2013.01); *H01L 27/3211* (2013.01); *H01L 27/3246* (2013.01); *H01L 27/3276* (2013.01); *H01L 51/5206* (2013.01); *H01L 51/5271* (2013.01); *H01L 51/56* (2013.01); *H01L 2227/323* (2013.01)

(58) Field of Classification Search
CPC combination set(s) only.
See application file for complete search history.

(56) References Cited

U.S. PATENT DOCUMENTS

| | | | |
|---|---|---|---|
| 2007/0102737 A1* | 5/2007 | Kashiwabara | H01L 27/3211 257/291 |
| 2013/0120981 A1* | 5/2013 | Kim | F21V 9/08 362/231 |
| 2014/0159012 A1* | 6/2014 | Song | H01L 27/3276 257/40 |
| 2015/0091786 A1* | 4/2015 | Yang | H01L 27/322 345/80 |
| 2015/0318334 A1* | 11/2015 | Kim | H01L 27/3213 257/40 |
| 2015/0380466 A1* | 12/2015 | Koo | H01L 27/3258 257/40 |
| 2016/0133681 A1* | 5/2016 | Nam | H01L 51/5265 257/40 |

* cited by examiner

*Primary Examiner* — Mamadou Diallo
(74) *Attorney, Agent, or Firm* — Andrew C. Cheng

(57) ABSTRACT

The present invention provides a COA WOLED structure and a manufacturing method thereof. The structure includes red/green/blue sub pixel zones and each sub pixel zone includes a substrate (1), a gate terminal (2), a gate insulation layer (3), an oxide semiconductor layer (4), an etch stop layer (5), source/drain terminals (6), a passivation protection layer (7), a red/green/blue photoresist layer (71/72/73), a planarization layer (8), a semi-reflection layer (9), an anode layer (10), a pixel definition layer (11), a photo spacer (12), a white light emission layer (13), a cathode layer (14), and a packaging lid (15). The present invention arranges a semi-transparent metal layer formed on a planarization layer to serve as a semi-reflection layer to use micro cavity resonance between an anode and a cathode and controls the thicknesses of the anode layers corresponding to the red/green/blue photoresist layers so as to obtain optimum micro cavity lengths for different colors of light thereby enhancing the light emission efficiency of the three primary colors of red/green/blue transmitting through a color filter and thus effectively improving the brightness of a COA WOLED device.

13 Claims, 5 Drawing Sheets

COA WOLED STRUCTURE AND MANUFACTURING METHOD THEREOF

BACKGROUND OF THE INVENTION

1. Field of the Invention

The present invention relates to the field of displaying technology, and in particular to a color filter on array (COA) white organic light emitting diode (WOLED) structure and a manufacturing method thereof.

2. The Related Arts

OLED is a flat panel displaying technique of extremely prosperous future and it shows excellent displaying performance and possesses various advantages, such as being self-luminous, simple structure, being ultra-thin, fast response, wide view angle, low power consumption, and being capable of achieving flexible displaying and is thus regarded as a "dream display". In addition, the investment of manufacturing installation is far less than that of TFT-LCDs (Thin-Film Transistor Liquid Crystal Displays) so that it is now favored by major display manufacturers and becomes the mainstream of the third-generation display devices in the field of displaying technology. Being on the eve of mass production, new techniques of OLED emerges virtually unlimitedly with the deepening of research and development thereof and thus, OLED displays are undergoing a breakthrough progress.

To achieve full colorization of OLED display devices, one way is achieved with superimposition of a WOLED and a color filter (CF). The superimposition of the WOLED and the CF allows for realization of high definition of the OLED display device without requiring precise and accurate masking operation.

A COA WOLED is a combination of the COA (CF on Array) technology and the WOLED technology. Using the COA technology allows a CF layer (red/green/blue photoresists) to be formed on an array substrate. And, white light emitting from a white light material of the OLED transmits through the red/green/blue photoresists to provide light of three primary colors of red, green, and blue. Compared to a conventional bottom emission OLED structure, such a technique does not suffer the constraint of being used to manufacture a large-sized panel as that of an organic evaporation mask so as to make it widely applicable to large-sized OLEDs.

FIG. 1 is a schematic view showing the structure of a red sub pixel zone of a conventional COA WOLED, which comprises a substrate 100, a gate terminal 200 formed on the substrate 10, a gate insulation layer 300 formed on the gate terminal 200, an island like oxide semiconductor layer 400 formed on the gate insulation layer 300, an island like etch stop layer 500 formed on the oxide semiconductor layer 400, source/drain terminals 600 formed on the etch stop layer 500, a passivation protection layer 700 formed on the source/drain terminals 600, a red photoresist layer 710 formed on the passivation protection layer 700, a planarization layer 800 formed on the passivation protection layer 700 and covering the red photoresist layer 710, an anode layer 101 formed on the planarization layer 800 and in contact engagement with the source/drain terminals 600 through a via 810, a pixel definition layer 110 formed on the anode layer 101, and a photo spacer 120 formed on the pixel definition layer 110. Structures of a green sub pixel zone and a blue sub pixel zone of the COA WOLED structure are similar to the red sub pixel zone.

One of the drawbacks of the above-described COA WOLED is the light emission efficiency of the three primary colors of red/green/blue is relatively low. A conventional top emission OLED device allows for adjustment of the thickness of the OLED device in order to make use of micro cavity resonance to effectively enhance the light emission efficiency. However, for the above-described COA WOLED, it is not possible to adjust the thickness of the device in the same way as the conventional OLED device in order to use the micro cavity effect to enhance the light emission efficiency of each color of light.

SUMMARY OF THE INVENTION

An object of the present invention is to provide a COA (Color Filter on Array) WOLED (White Organic Light Emitting Diode) structure, which provides relatively high light emission efficiency for the three primary colors of red/green/blue transmitting through a color filter.

Another object of the present invention is to provide a manufacturing method of a COA WOLED that enhances the light emission efficiency of the three primary colors of red/green/blue transmitting through a color filter so as to improve the brightness of a COA WOLED device.

To achieve the above object, the present invention provides a COA WOLED structure, which comprises a red sub pixel zone, a green sub pixel zone, and a blue sub pixel zone;

wherein the red sub pixel zone, the green sub pixel zone, and the blue sub pixel zone each comprises a substrate, a gate terminal arranged on the substrate, a gate insulation layer arranged on the gate terminal, an island like oxide semiconductor layer arranged on the gate insulation layer, an island like etch stop layer arranged on the oxide semiconductor layer, source/drain terminals arranged on the etch stop layer, a passivation protection layer arranged on the source/drain terminals, a red/green/blue photoresist layer arranged on the passivation protection layer, a planarization layer arranged on the passivation protection layer and covering the red/green/blue photoresist layer, a semi-reflection layer arranged on the planarization layer and in contact engagement with the source/drain terminals through a via, an anode layer arranged on the semi-reflection layer, a pixel definition layer arranged on the anode layer, a photo spacer arranged on the pixel definition layer, a white light emission layer arranged on the anode layer and the pixel definition layer, a cathode layer arranged on the white light emission layer, and a packaging lid arranged on the cathode layer; and wherein the anode layer of the red sub pixel zone has a thickness greater than a thickness of the anode layer of the green sub pixel zone and the thickness of the anode layer of the green sub pixel zone is greater than a thickness of the anode layer of the blue sub pixel zone.

The semi-reflection layer is made of a material comprising silver or copper or an alloy thereof and the cathode layer is made of a material comprising aluminum.

The semi-reflection layer has a thickness of 1-100 nm.

The thickness of the anode layer of the red sub pixel zone is 20-300 nm; the thickness of the anode layer of the green sub pixel zone is 20-250 nm; and the thickness of the anode layer of the blue sub pixel zone is 20-200 nm.

The oxide semiconductor layer is made of a material comprising indium gallium zinc oxide and the anode layer is made of a material comprising indium tin oxide.

The present invention also provides a manufacturing method of a COA WOLED, which comprises the following steps:

(1) providing a substrate and forming, in sequence on the substrate and corresponding to each of a red sub pixel zone, a green sub pixel zone, and a blue sub pixel zone, a gate terminal, a gate insulation layer, an oxide semiconductor layer, an etch stop layer, source/drain terminals, a passivation protection layer, a red/green/blue photoresist layer, a planarization layer, and a via;

(2) forming a semi-reflection layer on the planarization layer to correspond to each of the red/green/blue photoresist layers, wherein the semi-reflection layer is in contact engagement with the source/drain terminals through the via;

(3) forming an anode layer on the semi-reflection layer corresponding to each of the red sub pixel zone and the green sub pixel zone;

(4) further depositing an anode layer on the planarization layer in such a way that the anode layer covers the semi-reflection layer of the blue sub pixel zone;

(5) forming a photoresist layer on the anode layer corresponding to the semi-reflection layer of each of the red sub pixel zone and the blue sub pixel zone;

(6) subjecting the anode layer to etching with etching conditions being controlled so that the anode layer of the green sub pixel zone is partially etched off and removing the photoresist layer to obtain the anode layers of the red sub pixel zone, the green sub pixel zone, and the blue sub pixel zone;

(7) forming a pixel definition layer on each of the anode layers and forming a photo spacer on the pixel definition layer;

(8) forming white light emission layers on the anode layers and the pixel definition layers and between the photo spacers;

(9) forming cathode layers on the photo spacers and the white light emission layers;

(10) arranging a packaging lid on the cathode layers to package the COA WOLED so as to complete the manufacture of the COA WOLED.

Step (2) uses physical vapor deposition, photolithography, and etching operations to form the semi-reflection layer.

Step (3) uses physical vapor deposition, photolithography, and etching operations to form the anode layer.

Step (9) uses vapor deposition to form the white light emission layer.

The semi-reflection layer is made of a material comprising silver or copper or an alloy thereof; the cathode layer is made of a material comprising aluminum; the oxide semiconductor layer is made of a material comprising indium gallium zinc oxide; and the anode layer is made of a material comprising indium tin oxide.

The present invention further provides a COA WOLED structure, which comprises a red sub pixel zone, a green sub pixel zone, and a blue sub pixel zone;

wherein the red sub pixel zone, the green sub pixel zone, and the blue sub pixel zone each comprises a substrate, a gate terminal arranged on the substrate, a gate insulation layer arranged on the gate terminal, an island like oxide semiconductor layer arranged on the gate insulation layer, an island like etch stop layer arranged on the oxide semiconductor layer, source/drain terminals arranged on the etch stop layer, a passivation protection layer arranged on the source/drain terminals, a red/green/blue photoresist layer arranged on the passivation protection layer, a planarization layer arranged on the passivation protection layer and covering the red/green/blue photoresist layer, a semi-reflection layer arranged on the planarization layer and in contact engagement with the source/drain terminals through a via, an anode layer arranged on the semi-reflection layer, a pixel definition layer arranged on the anode layer, a photo spacer arranged on the pixel definition layer, a white light emission layer arranged on the anode layer and the pixel definition layer, a cathode layer arranged on the white light emission layer, and a packaging lid arranged on the cathode layer;

wherein the anode layer of the red sub pixel zone has a thickness greater than a thickness of the anode layer of the green sub pixel zone and the thickness of the anode layer of the green sub pixel zone is greater than a thickness of the anode layer of the blue sub pixel zone;

wherein the semi-reflection layer is made of a material comprising silver or copper or an alloy thereof and the cathode layer is made of a material comprising aluminum; and wherein the semi-reflection layer has a thickness of 1-100 nm.

The efficacy of the present invention is that the present invention provides a COA WOLED structure, which comprises a planarization layer on which a semi-transparent metal layer is formed to serve as a semi-reflection layer and anode layers corresponding to red/green/blue photoresist layers have different thicknesses so as to form an optimum micro cavity structure for each color of light whereby micro cavity resonance induced between an anode and a cathode is used to enhance light emission efficiency of the three primary colors of red/green/blue transmitting through a color filter. The present invention provides a manufacturing method of a COA WOLED, which forms a metal layer on a planarization layer to serve as a semi-reflection layer to use micro cavity resonance induced between an anode and a cathode and controls the thicknesses of the anode layers of the red/green/blue photoresist layers to obtain an optimum micro cavity length of each color of light so as to enhance light emission efficiency of the three primary colors of red/green/blue transmitting through a color filter thereby improving brightness of a COA WOLED device.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
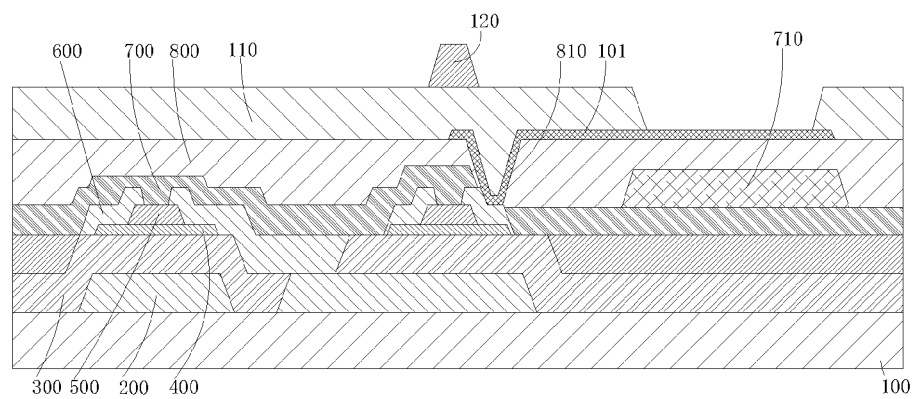
FIG. 1 is a schematic cross-sectional view showing a conventional color filter on array (COA) white organic light emitting diode (WOLED) structure.
Figure 2:
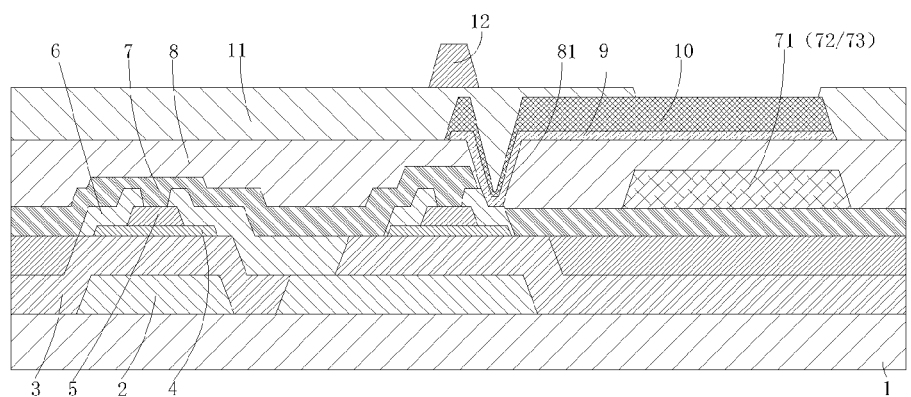
FIG. 2 is a schematic cross-sectional view showing a red/green/blue sub pixel zone of a COA WOLED structure according to the present invention.
Figure 3:
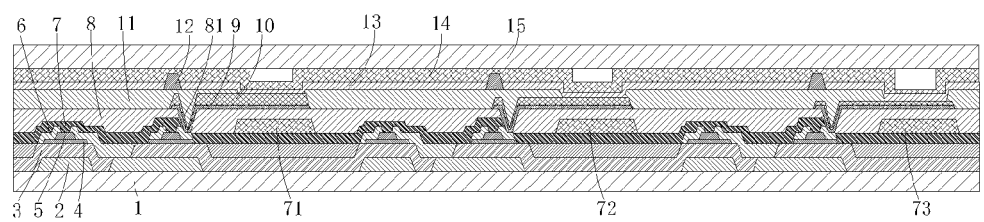
FIG. 3 is a schematic cross-sectional view showing a COA WOLED structure according to the present invention.

Referring collectively to FIGS. 2 and 3, the present invention provides a color filter on array (COA) white organic light emitting diode (WOLED) structure, which as shown in FIG. 3, comprises a red sub pixel zone, a green sub pixel zone, and a blue sub pixel zone.

As shown in FIG. 2, the red sub pixel zone, the green sub pixel zone, and the blue sub pixel zone each comprises a substrate 1, a gate terminal 2 arranged on the substrate 1, a gate insulation layer 3 arranged on the gate terminal 2, an island like oxide semiconductor layer 4 arranged on the gate insulation layer 3, an island like etch stop layer 5 arranged on the oxide semiconductor layer 4, source/drain terminals 6 arranged on the etch stop layer 5, a passivation protection layer 7 arranged on the source/drain terminals 6, a red/green/blue photoresist layer 71/72/73 arranged on the passivation protection layer 7, a planarization layer 8 arranged on the passivation protection layer 7 and covering the red/green/blue photoresist layer 71/72/73, a semi-reflection layer 9 arranged on the planarization layer 8 and in contact engagement with the source/drain terminals 6 through a via 81, an anode layer 10 arranged on the semi-reflection layer 9, a pixel definition layer 11 arranged on the anode layer 10, a photo spacer 12 arranged on the pixel definition layer 11, a white light emission layer 13 arranged on the anode layer 10 and the pixel definition layer 11, a cathode layer 14 arranged on the white light emission layer 13, and a packaging lid 15 arranged on the cathode layer 14.

The anode layer 10 of the red sub pixel zone has a thickness greater than a thickness of the anode layer 10 of the green sub pixel zone and the thickness of the anode layer 10 of the green sub pixel zone is greater than a thickness of the anode layer 10 of the blue sub pixel zone.

Preferably, the semi-reflection layer 9 is made of a material that comprises a metal or an alloy having a relatively high transmittance, such as silver and copper. The cathode layer 14 is made of a material comprising aluminum to serve as a reflective layer. Preferably, the semi-reflection layer 9 has a thickness of 1-100 nm.

The thickness of the anode layer 10 of the red sub pixel zone is 20-300 nm; the thickness of the anode layer 10 of the green sub pixel zone is 20-250 nm; and the thickness of the anode layer 10 of the blue sub pixel zone is 20-200 nm.

Preferably, the oxide semiconductor layer 4 is made of a material comprising indium gallium zinc oxide (IGZO) and the anode layer 10 is made of a material comprising indium tin oxide (ITO).

In the above-described COA WOLED structure, a semi-transparent metal layer is arranged on the planarization layer to serve as the semi-reflection layer and the anode layers 10 corresponding to the red/green/blue photoresist layers have different thicknesses in order to form optimum micro cavity structures for different colors of light whereby micro cavity resonance induced between anode and cathode can be used to effectively increase the light emission efficiency for the three primary colors of red/green/blue of the color filter.

Figure 4:
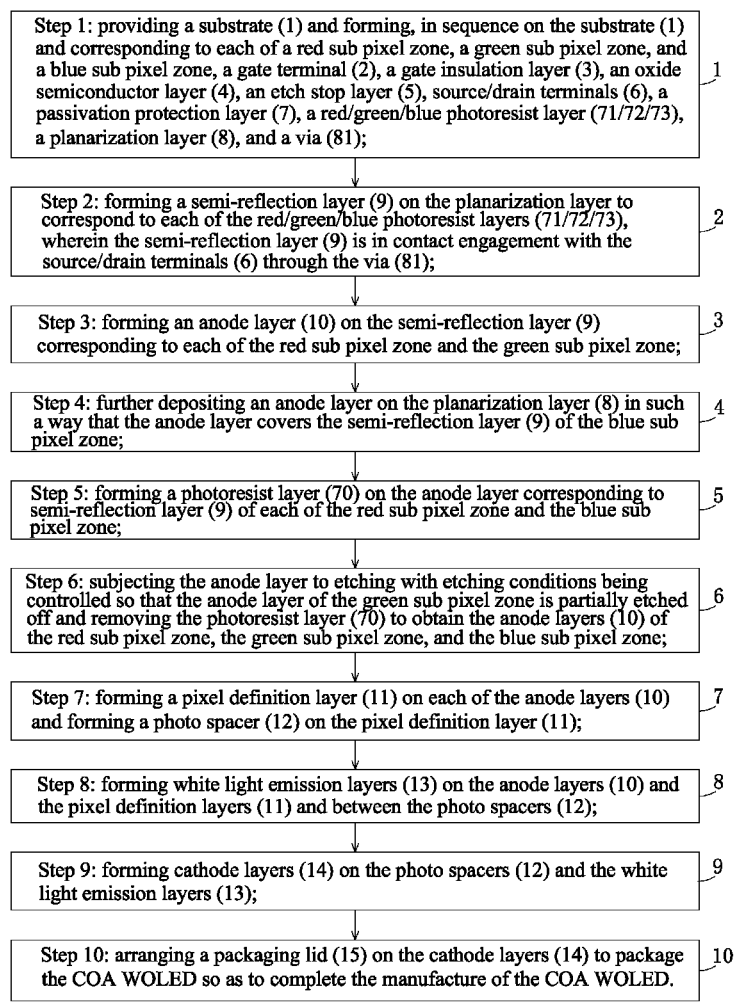
FIG. 4 is a flow chart illustrating a manufacture method of a COA WOLED according to the present invention.
Figure 5:
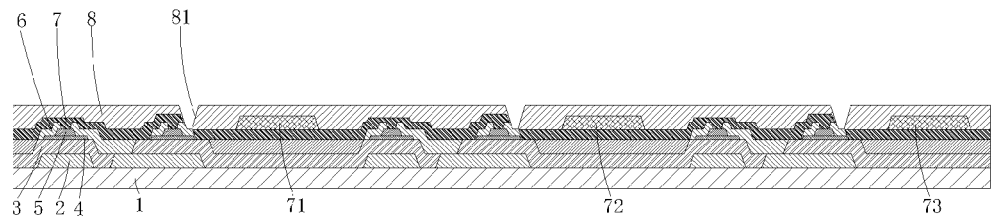
FIG. 5 is a schematic view illustrating step 1 of the manufacturing method of the COA WOLED according to the present invention.

Referring to FIG. 4, the present invention also provides a manufacture method of a COA WOLED, which comprises the following steps:

Step 1: as shown in FIG. 5, providing a substrate 1 and forming, in sequence on the substrate 1 and corresponding to each of a red sub pixel zone, a green sub pixel zone, and a blue sub pixel zone, a gate terminal 2, a gate insulation layer 3, an oxide semiconductor layer 4, an etch stop layer 5, source/drain terminals 6, a passivation protection layer 7, a red/green/blue photoresist layer 71/72/73, a planarization layer 8, and a via 81.

Preferably, the oxide semiconductor layer 4 is made of a material comprising indium gallium zinc oxide (IGZO).

Figure 6:
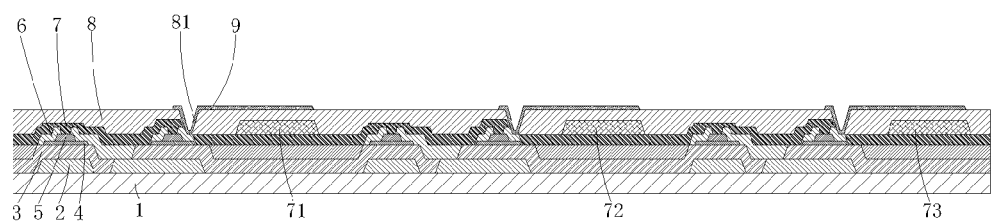
FIG. 6 is a schematic view illustrating step 2 of the manufacturing method of the COA WOLED according to the present invention.

Step 2: as shown in FIG. 6, forming a semi-reflection layer 9 on the planarization layer to correspond to each of the red/green/blue photoresist layers 71/72/73, wherein the semi-reflection layer 9 is in contact engagement with the source/drain terminals 6 through the via 81.

Specifically, physical vapor deposition, photolithography, and etching operations are used to form the semi-reflection layer 9.

Preferably, the semi-reflection layer 9 is made of a material that comprises a metal or an alloy having a relatively high transmittance, such as silver and copper. The cathode layer 14 is made of a material comprising aluminum to serve as a reflective layer.

Figure 7:
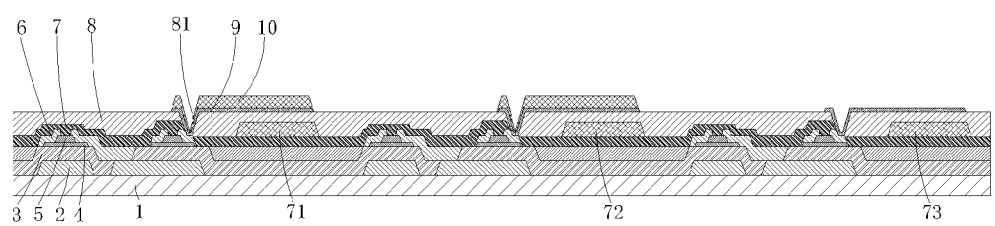
FIG. 7 is a schematic view illustrating step 3 of the manufacturing method of the COA WOLED according to the present invention.

Step 3: as shown in FIG. 7, forming an anode layer 10 on the semi-reflection layer 9 corresponding to each of the red sub pixel zone and the green sub pixel zone.

Preferably, the anode layer 10 is made of a material comprising indium tin oxide (ITO).

Specifically, physical vapor deposition, photolithography, and etching operations are used to form the anode layer.

Figure 8:
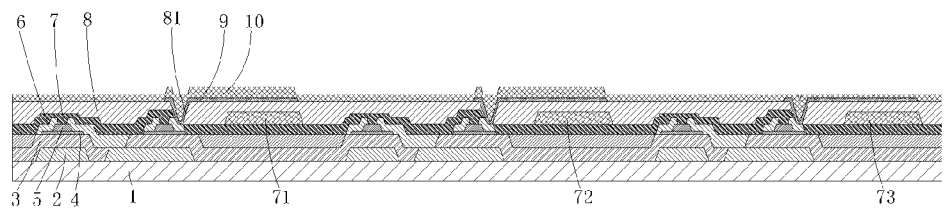
FIG. 8 is a schematic view illustrating step 4 of the manufacturing method of the COA WOLED according to the present invention.

Step 4: as shown in FIG. 8, further depositing an anode layer on the planarization layer 8 in such a way that the anode layer covers the semi-reflection layer 9 of the blue sub pixel zone.

Figure 9:
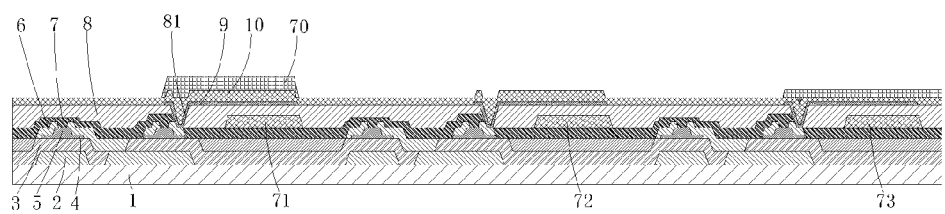
FIG. 9 is a schematic view illustrating step 5 of the manufacturing method of the COA WOLED according to the present invention.

Step 5: as shown in FIG. 9, forming a photoresist layer 70 on the anode layer corresponding to the semi-reflection layer 9 of each of the red sub pixel zone and the blue sub pixel zone.

Figure 10:
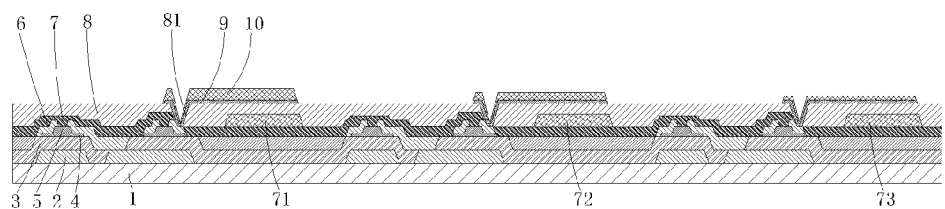
FIG. 10 is a schematic view illustrating step 6 of the manufacturing method of the COA WOLED according to the present invention.

Step 6: as shown in FIG. 10, subjecting the anode layer to etching with etching conditions being controlled so that the anode layer of the green sub pixel zone is partially etched off and removing the photoresist layer 70 to obtain the anode layers 10 of the red sub pixel zone, the green sub pixel zone, and the blue sub pixel zone.

The anode layers 10 of the red sub pixel zone, the green sub pixel zone, and the blue sub pixel zone so obtained have different thicknesses. Specifically, the thickness of the anode layer 10 of the red sub pixel zone is greater than the thickness of the anode layer 10 of the green sub pixel zone and the thickness of the anode layer 10 of the green sub pixel zone is greater than the thickness of the anode layer 10 of the blue sub pixel zone.

Step 7: forming a pixel definition layer 11 on each of the anode layers 10 and forming a photo spacer 12 on the pixel definition layer 11.

Step 8: forming white light emission layers 13 on the anode layers 10 and the pixel definition layers 11 and between the photo spacers 12.

Specifically, vapor deposition is used to form the white light emission layers 13.

Step 9: forming cathode layers 14 on the photo spacers 12 and the white light emission layers 13.

Preferably, the cathode layers 14 are made of a material comprising aluminum to serve as a reflection layer.

Step 10: arranging a packaging lid 15 on the cathode layers 14 to package the COA WOLED so as to complete the manufacture of the COA WOLED.

In the above manufacturing process of a COA WOLED, a semi-transparent metal layer is formed on a planarization layer to serve as a semi-reflection layer to use micro cavity resonance induced between an anode and a cathode and the thicknesses of the anode layers corresponding to the red/green/blue photoresist layers are so controlled as to obtain optimum micro cavity lengths corresponding to different colors of light thereby enhancing the light emission efficiency of the three primary colors of red/green/blue transmitting through a color filter.

In summary, the present invention provides a COA WOLED structure, which comprises a planarization layer on which a semi-transparent metal layer is formed to serve as a semi-reflection layer and anode layers corresponding to red/green/blue photoresist layers have different thicknesses so as to form an optimum micro cavity structure for each color of light whereby micro cavity resonance induced between an anode and a cathode is used to enhance light emission efficiency of the three primary colors of red/green/blue transmitting through a color filter. The present invention provides a manufacturing method of a COA WOLED, which forms a metal layer on a planarization layer to serve as a semi-reflection layer to use micro cavity resonance induced between an anode and a cathode and controls the thicknesses of the anode layers of the red/green/blue photoresist layers to obtain an optimum micro cavity length of each color of light so as to enhance light emission efficiency of the three primary colors of red/green/blue transmitting through a color filter thereby improving brightness of a COA WOLED device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A color filter on array (COA) white organic light emitting diode (WOLED) structure, comprising a red sub pixel zone, a green sub pixel zone, and a blue sub pixel zone;
   wherein the red sub pixel zone, the green sub pixel zone, and the blue sub pixel zone each comprises a substrate, a gate terminal arranged on the substrate, a gate insulation layer arranged on the gate terminal, an island like oxide semiconductor layer arranged on the gate insulation layer, an island like etch stop layer arranged on the oxide semiconductor layer, source/drain terminals arranged on the etch stop layer, a passivation protection layer arranged on the source/drain terminals, a red/green/blue photoresist layer arranged on the passivation protection layer, a planarization layer arranged on the passivation protection layer and covering the red/green/blue photoresist layer, a semi-reflection layer arranged on the planarization layer and in contact engagement with the source/drain terminals through a via, an anode layer arranged on the semi-reflection layer, a pixel definition layer arranged on the anode layer, a photo spacer arranged on the pixel definition layer, a white light emission layer arranged on the anode layer and the pixel definition layer, a cathode layer arranged on the white light emission layer, and a packaging lid arranged on the cathode layer; and
   wherein the anode layer of the red sub pixel zone has a thickness greater than a thickness of the anode layer of the green sub pixel zone and the thickness of the anode layer of the green sub pixel zone is greater than a thickness of the anode layer of the blue sub pixel zone.

2. The COA WOLED structure as claimed in claim 1, wherein the semi-reflection layer is made of a material comprising silver or copper or an alloy thereof and the cathode layer is made of a material comprising aluminum.

3. The COA WOLED structure as claimed in claim 1, wherein the semi-reflection layer has a thickness of 1-100 nm.

4. The COA WOLED structure as claimed in claim 1, wherein the thickness of the anode layer of the red sub pixel zone is 20-300 nm; the thickness of the anode layer of the green sub pixel zone is 20-250 nm; and the thickness of the anode layer of the blue sub pixel zone is 20-200 nm.

5. The COA WOLED structure as claimed in claim 1, wherein the oxide semiconductor layer is made of a material comprising indium gallium zinc oxide and the anode layer is made of a material comprising indium tin oxide.

6. A manufacturing method of a color filter on array (COA) white organic light emitting diode (WOLED), comprising the following steps:
   (1) providing a substrate and forming, in sequence on the substrate and corresponding to each of a red sub pixel zone, a green sub pixel zone, and a blue sub pixel zone, a gate terminal, a gate insulation layer, an oxide semiconductor layer, an etch stop layer, source/drain terminals, a passivation protection layer, a red/green/blue photoresist layer, a planarization layer, and a via;
   (2) forming a semi-reflection layer on the planarization layer to correspond to each of the red/green/blue photoresist layers, wherein the semi-reflection layer is in contact engagement with the source/drain terminals through the via;
   (3) forming an anode layer on the semi-reflection layer corresponding to each of the red sub pixel zone and the green sub pixel zone;
   (4) further depositing an anode layer on the planarization layer in such a way that the anode layer covers the semi-reflection layer of the blue sub pixel zone;
   (5) forming a photoresist layer on the anode layer corresponding to the semi-reflection layer of each of the red sub pixel zone and the blue sub pixel zone;
   (6) subjecting the anode layer to etching with etching conditions being controlled so that the anode layer of the green sub pixel zone is partially etched off and removing the photoresist layer to obtain the anode layers of the red sub pixel zone, the green sub pixel zone, and the blue sub pixel zone;
   (7) forming a pixel definition layer on each of the anode layers and forming a photo spacer on the pixel definition layer;
   (8) forming white light emission layers on the anode layers and the pixel definition layers and between the photo spacers;
   (9) forming cathode layers on the photo spacers and the white light emission layers;
   (10) arranging a packaging lid on the cathode layers to package the COA WOLED so as to complete the manufacture of the COA WOLED.

7. The manufacturing method of the COA WOLED as claimed in claim 6, wherein step (2) uses physical vapor deposition, photolithography, and etching operations to form the semi-reflection layer.

8. The manufacturing method of a COA WOLED as claimed in claim 6, wherein step (3) uses physical vapor deposition, photolithography, and etching operations to form the anode layer.

9. The manufacturing method of a COA WOLED as claimed in claim 6, wherein step (9) uses vapor deposition to form the white light emission layer.

10. The manufacturing method of a COA WOLED as claimed in claim 6, wherein the semi-reflection layer is made of a material comprising silver or copper or an alloy thereof; the cathode layer is made of a material comprising aluminum; the oxide semiconductor layer is made of a material comprising indium gallium zinc oxide; and the anode layer is made of a material comprising indium tin oxide.

11. A color filter on array (COA) white organic light emitting diode (WOLED) structure, comprising a red sub pixel zone, a green sub pixel zone, and a blue sub pixel zone;
wherein the red sub pixel zone, the green sub pixel zone, and the blue sub pixel zone each comprises a substrate, a gate terminal arranged on the substrate, a gate insulation layer arranged on the gate terminal, an island like oxide semiconductor layer arranged on the gate insulation layer, an island like etch stop layer arranged on the oxide semiconductor layer, source/drain terminals arranged on the etch stop layer, a passivation protection layer arranged on the source/drain terminals, a red/green/blue photoresist layer arranged on the passivation protection layer, a planarization layer arranged on the passivation protection layer and covering the red/green/blue photoresist layer, a semi-reflection layer arranged on the planarization layer and in contact engagement with the source/drain terminals through a via, an anode layer arranged on the semi-reflection layer, a pixel definition layer arranged on the anode layer, a photo spacer arranged on the pixel definition layer, a white light emission layer arranged on the anode layer and the pixel definition layer, a cathode layer arranged on the white light emission layer, and a packaging lid arranged on the cathode layer;
wherein the anode layer of the red sub pixel zone has a thickness greater than a thickness of the anode layer of the green sub pixel zone and the thickness of the anode layer of the green sub pixel zone is greater than a thickness of the anode layer of the blue sub pixel zone;
wherein the semi-reflection layer is made of a material comprising silver or copper or an alloy thereof and the cathode layer is made of a material comprising aluminum; and
wherein the semi-reflection layer has a thickness of 1-100 nm.

12. The COA WOLED structure as claimed in claim 11, wherein the thickness of the anode layer of the red sub pixel zone is 20-300 nm; the thickness of the anode layer of the green sub pixel zone is 20-250 nm; and the thickness of the anode layer of the blue sub pixel zone is 20-200 nm.

13. The COA WOLED structure as claimed in claim 11, wherein the oxide semiconductor is made of a material comprising indium gallium zinc oxide and the anode layer is made of a material comprising indium tin oxide.

* * * * *